United States Patent [19]

Dao et al.

[11] 4,081,822
[45] Mar. 28, 1978

[54] THRESHOLD INTEGRATED INJECTION LOGIC

[75] Inventors: Tich T. Dao; Patrick A. Tucci, both of Cupertino, Calif.

[73] Assignee: Signetics Corporation, Sunnyvale, Calif.

[21] Appl. No.: 591,400

[22] Filed: Jun. 30, 1975

[51] Int. Cl.² .......................................... H01L 27/04
[52] U.S. Cl. ..................................... 357/44; 357/35; 357/36; 357/46; 357/86; 307/211; 307/299 B
[58] Field of Search ........................... 357/44, 46, 86; 307/211, 299 B

[56] References Cited

U.S. PATENT DOCUMENTS

| | | | |
|---|---|---|---|
| 3,248,529 | 4/1966 | Buelow et al. | 307/211 |
| 3,275,812 | 9/1966 | Coates, Jr. et al. | 307/211 |
| 3,644,923 | 2/1972 | Foerster | 307/211 |
| 3,736,477 | 5/1973 | Berger et al. | 357/44 |
| 3,914,622 | 10/1975 | Pezzolo | 307/299 B |
| 3,916,215 | 10/1975 | Gaskill, Jr. et al. | 307/211 |

OTHER PUBLICATIONS

Elmasry, "Nonsaturated I.I.L.", Electronics Letters, 6th Feb. 1975, vol. 11, No. 3, pp. 63, 64, 68.
Hart, et al., Electronics, Oct. 1974, pp. 111–118.

*Primary Examiner*—William D. Larkins
*Attorney, Agent, or Firm*—C. Richard Pfeiffer; William H. Dana

[57] ABSTRACT

Integrated injection logic circuits and semiconductor devices employing threshold functions. Multiple-collector input transistors have their collectors connected to the bases of one or more output transistors. The output transistors have different weighted levels of injection current. The switching states of the output transistors are functions of the number of and conduction state of input transistors to which the output transistor are connected and to the weight of the injection current associated with the output transistor.

18 Claims, 11 Drawing Figures

THRESHOLD INTEGRATED INJECTION LOGIC

BACKGROUND OF THE INVENTION

The present invention relates to semiconductor circuits and particularly to logic circuits employing threshold functions and employing integrated injection logic devices.

Logic circuits employing threshold functions have been generally known for a long time. Threshold functions generally encompass digital signals which include more levels than the two levels of conventional binary signals. One example of a threshold logic gate is described in U.S. Pat. No. 3,838,393 invented by Tich T. Dao and assigned to the assignee of the present invention. The threshold functions in that patent are generated using emitter-coupled logic (ECL) devices.

Although threshold functions have been well known, they have not been employed widely in the design of semiconductor circuits. One reason that they have not been employed widely is because threshold functions are more complex than simple binary functions. The complexity has apparently discouraged use on a widespread basis whether emitter-coupled logic (ECL), integrated injection logic (I²L), or other forms of logic devices are employed.

Injection logic generally includes switching transistors which are controlled by input signals to be either in the conducting (ON) or the non-conducting (OFF) state. In order to enhance the switching characteristics of the switching transistors, semiconductor injection devices (e.g., injection transistor) are utilized to inject carriers into the base regions of the switching transistors. The switching transistors and the injection devices can be integrated into a common structure in order to achieve the general objectives of semiconductor technology.

The general objectives of semiconductor technology are to increase circuit density, increase switching speed, increase reliability, while decreasing cost. It is a general objective of the present invention to provide circuits and semiconductor devices which improve upon these general objectives.

SUMMARY OF THE INVENTION

The present invention is an improved integrated injection logic circuit and device which employs threshold functions.

Multiple-collector input transistors are employed to switch states under control of binary input signals. One of the multiple collectors in each transistor is connected, in one embodiment of the invention, to the input base in order to normalize currents in all of the collectors. The collectors of the input transistors are connected to the bases of one or more output transistors. The output transistors have different-threshold weights determined by different levels of injection current. The ON or OFF state of each output transistor is controlled by its threshold weight and by the state of one or more input transistors to which it is connected. The injection current conducts into the output transistor base or into an input transistor collector depending upon whether the input transistor is ON or OFF. Single-weighted output transistors switch states when at least a single connected input transistor switches state. Double-weighted output transistors switch states only when at least two connected input transistors switch states. Triple-weighted output transistors switch states only when three or more connected input transistors switch states. In a similar manner, weights of four or more are possible.

In one embodiment of the invention, input and output transistors are fabricated in an integrated injection logic structure. A support layer carries an N-type epitaxial region. Within the N region, a first P-type region, P1, is formed. Within the P1 region, one or more N+ regions are formed. The N+, P1, and N regions form an input switching transistor with one or more collectors. The N+ regions are collectors, the P1 region is a common base, and the N region is a common emitter. A second P-type region, P2, is also formed in the N region. The P2 region is juxtaposed the P1 region and is separated from the P1 region by N-type material. The P2, N, P1 regions form a PNP injection transistor where the P2 region is the emitter, the N region is the base, and the P1 region is the collector. The injection transistor is typically a lateral transistor in which the level of injection is determined by the size of the base/collector (N/P1) interface in the vicinity of emitter/base (P2/N) interface. When conventional semiconductor technologies are employed, the N/P1 base/collector interface is conviently defined by a linear dimension, D. A base/collector interface of dimension D provides a single-weighted level of injection current. When it is desired to double the injection current level, the base/collector interface is doubled to a dimension 2D. When injection current at three times the single-weighted level is desired, then the dimension is expanded to 3D. For higher levels of injection, higher multiples of D are utilized.

Combinations of the multiple-collector input transistors and the multiple-weighted output transistors are combined in integrated structures utilizing threshold functions to form AND gates, OR gates, EXCLUSIVE-OR gates, full adders and other circuits.

The foregoing and other objects, features and advantages of the invention will be apparent from the following more particular description of preferred embodiments of the invention, as illustrated in the accompanying drawings.

Figure 1:
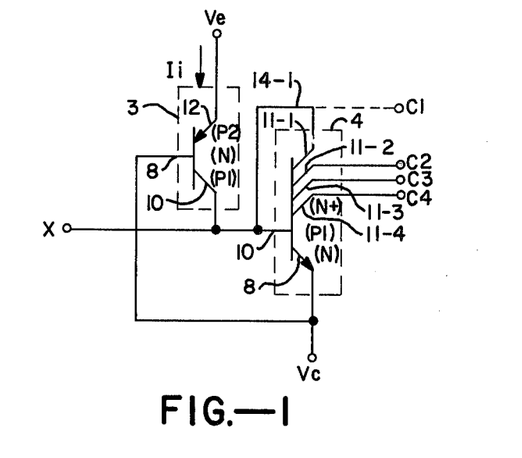
FIG. 1 depicts an electrical schematic representation of a multiple-collector transistor, having a collector/base normalization connection, in combination with an injection transistor which provides single-weighted injection current.
Figure 2:
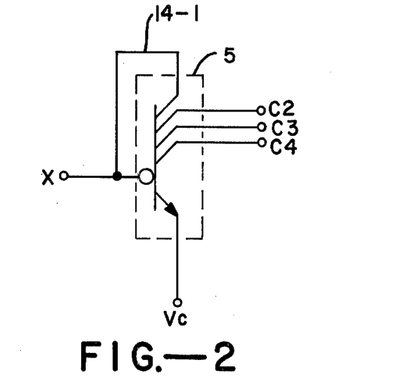
FIG. 2 depicts a simplified symbolic representation of the FIG. 1 device.

Multiple-collector Transistor Circuit — FIGS. 1 and 2

In FIG. 1, a multiple-collector input transistor 4 includes the four collectors 11-1, 11-2, 11-3 and 11-4 which provide the collector outputs C1, C2, C3, and C4, respectively. The collector 11-1, in accordance with one aspect of the present invention, is connected by a conductor 14-1 to the base 10 and the output C1 is the same as the base input, X. Transistor 4 has emitter 8 connected to a potential source, Vc.

In FIG. 1, injection transistor 3 has an emitter 12, a base 8, and a collector 10. The collector 10 is connected in common with the base 10 of transistor 4. The base 8 of transistor 3 is connected in common with the emitter 8 of transistor 4. The emitter 12 of the injection transistor 3 is connected to a potential source, Ve. The potential Vc is more negative than the potential Ve.

The transistor circuitry of FIG. 1 provides an injection current, Ii, conducted from the source, Ve, through the emitter 12 and collector 10 of transistor 3. The transistor 3 is always biased in the conduction state.

The switching transistor 4 is controlled to be in the conduction state (ON) or in the non-conduction state (OFF) as a function of the X input. When X is a logical 1 then the transistor 4 is ON. When X is a logical 0, then transistor 4 is OFF. A logical 1 is provided at the X terminal, for example, by connection to a collector of a transistor (not shown but like transistor 4) which is in the OFF condition. A logical 0 is provided to the X terminal, for example, by turning that transistor (not shown) ON. When X is connected to a logical 0, the injection current, Ii, is conducted from the collector 10 of transistor 3 through the terminal X. Under these conditions the collector outputs C2, C3, and C4 and the switching transistor 4 are unable to conduct because transistor 4 is OFF. Therefore, the collector current Ic, in each of the collectors of transistor 4 is equal to zero.

Under the condition that X is a logical 1, the current through the X terminal is zero. The relationship between the currents in the switching transistor 4 and the injection current provided by 3 is given as follows:

$$Ib = Ii - Ic \qquad \text{Eq. (1)}$$

where:

Ib = base current of transistor 4
Ii = injection current from transistor 3
Ic = collector current in each collector of transistor 4

The base current Ib of the multiple-collector transistor 4 is also determined by the base/collector current gain and is defined as follows:

$$Ib = nIc/\beta \qquad \text{Eq. (2)}$$

where:

Ic = collector current in each collector of transistor 4
n = number of collectors of transistor 4
β = base/collector current gain of transistor 4

In Eq. (2), the quantity "nIc" represents the total collector current in all of the collectors of transistor 4. In the example of FIG. 1, there are four collectors and hence "n" is equal to 4.

The value of "n" is typically between 1 and 6 in the present state of the art. Of course, larger numbers of collectors can be employed.

If the value of Ib from Eq. (2) is substituted into Eq. (1), the result appears as follows:

$$nIc/\beta = Ii - Ic \qquad \text{Eq. (3)}$$

If Eq. (3) is transposed, the collector current is defined as follows:

$$Ic = Ii/(1 + n/\beta) \qquad \text{Eq. (4)}$$

Because the multiple-collector structure such as described in FIGS. 3 and 4 hereinafter produces transistors having relatively small β's (typically between 5 and 15), the term n/β in Eq. (4) cannot be ignored. Therefore, injection currents supplying collectors are reduced by the term $1/(1+n/\beta)$ in accordance with Eq. (4) as hereinafter described.

In FIG. 2, a symbolic representation of the FIG. 1 circuit is shown. In FIG. 2, the transistor 5 represents the combination of transistors 3 and 4 in FIG. 1. The normalization feedback connection 14-1 is shown in both FIGS. 1 and 2.

Figure 3:
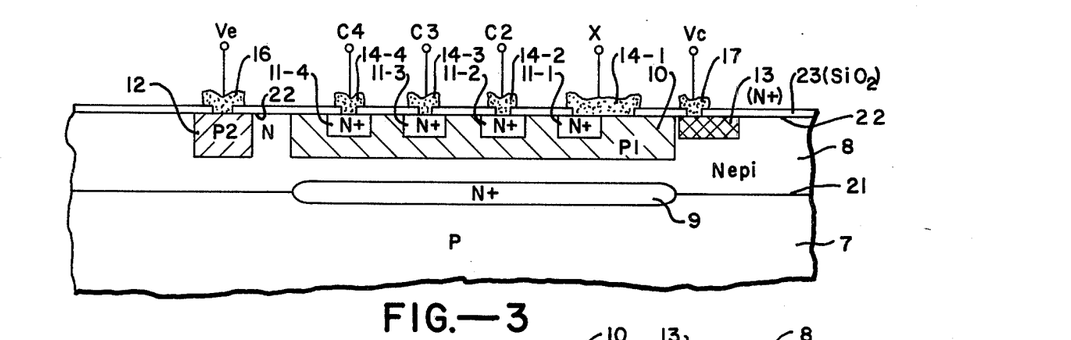
FIG. 3 depicts a front view of a semiconductor structure which is one embodiment of the FIG. 1 device.
Figures 4, 5, 6:
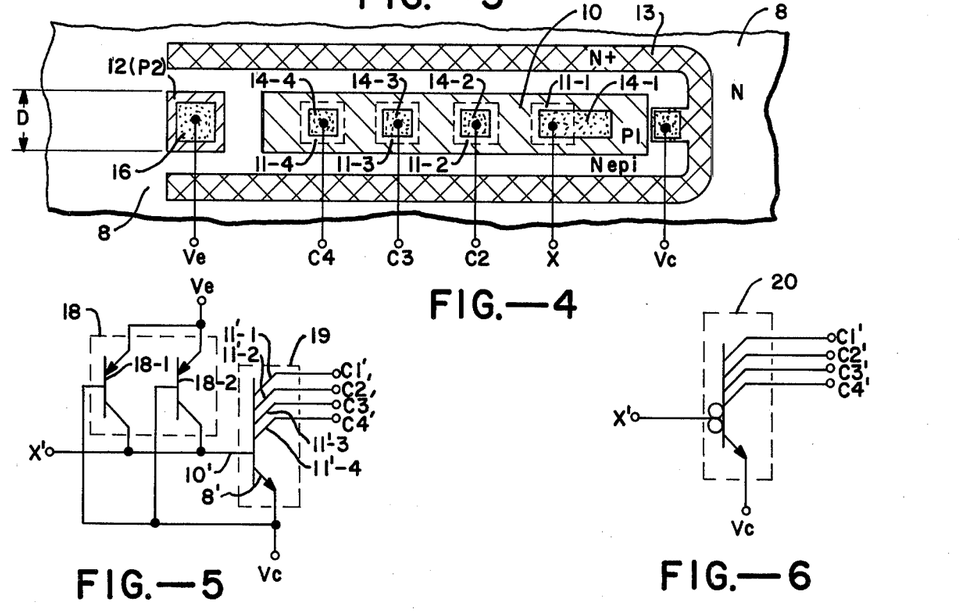
FIG. 4 depicts a top view of the semiconductor structure of FIG. 3.
FIG. 5 depicts an electrical schematic representation of a multiple-collector transistor, without a collector/base normalization connection, in combination with an injection transistor structure which provides double-weighted injection current.
FIG. 6 depicts a symbolic representation of the FIG. 5 device.

Single-Weighted Semiconductor Structure — FIGS. 3 and 4

In FIG. 3, a semiconductor structure which is one embodiment of the FIG. 1 device is shown. A semiconductor P region 7 forms a support for the FIG. 3 structure. An N region 8 is established on the surface 21 of the support 7. Also, a buried N+ region 9 is formed between the N region 8 and the support 7. The N+ region 9 enhances the conductivity for the N region 8 in a conventional manner.

A first P region (P1) 10 is located in the N region 8 and is typically formed using well known diffusion or other semicondutor processing steps. Also, a second P region (P2) 12, is similarly formed in the N region 8. The P2 region is juxtapositioned the P1 region so that a portion of the N region 8 extends to the surface plane 22 of region 8 between the P2 and the P1 regions.

Within the P1 region, a plurality of N+ regions 11-1 through 11-4 are formed extending from surface plane 22 of the P1 region into the P1 region. Diffusion or other conventional semiconductor processing steps are typically employed. A silicon dioxide layer 23 is provided with windows opening above the regions 13, 10, 11-1 through 11-4 and 12. Conductors extend through the windows and make electrical contact with the regions below. The conductors are typically metal layers. Specifically, a conductor 16 extends through the layer 22 and contacts the P2 region 12. The conductor 16 is connected to the source potential Ve. Conductors 14-2, 14-3, and 14-4 connect to the N+ regions 11-2, 11-3, and 11-4, respectively. Conductor 14-1 connects both to the N+ region 11-1 and to the P1 region 10 and thereby makes the collector/base normalization connection. The conductor 17 connects to the N+ region 13 and provides a connection to the source potential Vc. The N+ region 13 is also formed into the N region and extends to surface plane 22. The N+ region 13 acts as an isolation bar and surrounds the structure of FIG. 3 as shown in FIG. 4.

In FIG. 4, a top view of the semiconductor structure of FIG. 3 is shown. In FIG. 4, the silicon dioxide layer 23 of FIG. 3 has been ignored so that the relationship between the other regions can be determined more clearly. In FIG. 4, it is apparent that the N+ isolation region 13 surrounds the P2 region 12 and the P1 region 10 and the other regions formed therein. Also, the interface between the P1 and N regions, in the vicinity of the P2 region, has a linear dimension D. The magnitude of D determines the level of injection current into the P1 region 10. In a typical embodiment, D is equal to 18 microns.

Double-Weighted Transistor Circiut — FIGS. 5 and 6

In FIG. 5, a double-weighted injection transistor circuit is shown. The multiple-collector switching transistor 19 in FIG. 5 is analogous to the multiple-collector switching transistor 4 in FIG. 1. In FIG. 5, however, the collector 11'-1 is not connected to the base 10'. The emitter 8' is connected to the more-negative supply potential Vc and the base 10' is connected to X'.

An injection transistor structure 18 is shown including injection transistors 18-1 and 18-2. Each of the transistors 18-1 and 18-2 is biased to conduct injection current, Ii, into the base 10' and out through terminal X' to a current sink (not shown). The total injected current in the FIG. 5 produced by structure 18 is 2Ii. The injected current in FIG. 5 is, therefore, twice the injected current in FIG. 1. The ON and OFF conduction state of transistor 19 is controlled by the logical 1 or logical 0 state of the input on the X terminal. A logical 1 exists on the X terminal whenever current of magnitude 2Ii cannot be conducted out through the X terminal and hence the transistor 19 is ON. If the X terminal is connected to more than one output current sink, some portion of the 2Ii injection current may be conducted through the X terminal. Transistor 19 is not turned OFF unless substantially all of the 2Ii injection current is conducted out through the X terminal. A current sink connected at the terminal X' of the FIG. 5 circuit requires twice the capacity as a current sink connected on the X terminal of FIG. 1 circuit.

FIG. 6 is a symbolic representation of the FIG. 5 circuit. The double circle at the base of transistor 20 in FIG. 6 represents the double-weighted injection current provided by the transistor structure 18 in FIG. 5. By way of comparison, the single circle on the base of the transistor 5 in FIG. 2 represents a single-weighted injection current as provided by the transistor 3 in FIG. 1.

Figure 7:
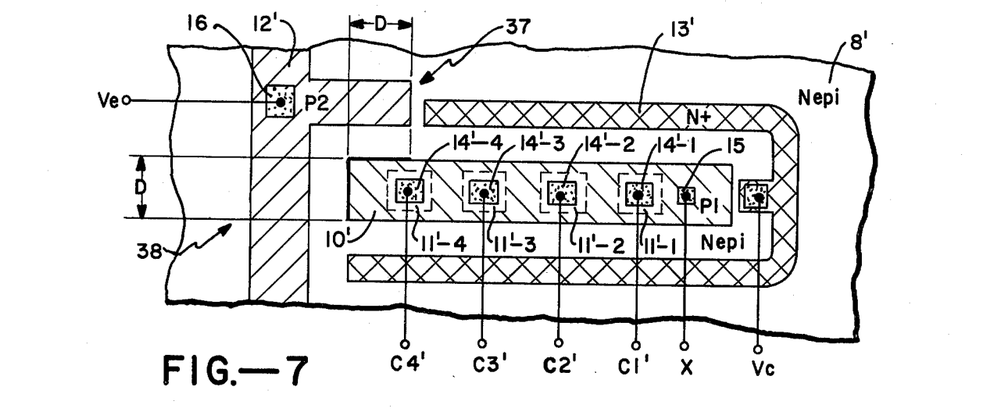
FIG. 7 depicts a top view of a semiconductor structure which is one embodiment of the double-weighted injection device of FIG. 5.

Double-Weighted Semiconductor Structure — FIG. 7.

In FIG. 7, a top view of a semiconductor structure which is one embodiment of the FIG. 5 double-weighted circuit is shown. The P1 region 10', the N+ regions 11'-1 through 11'-4, the N+ region 13' and the conductors 14'-1 through 14'-4 are analogous to the like-numbered regions in FIG. 4. In FIG. 7, the P2 region 12' differs from the region 12 in FIG. 4 in that it is juxtaposed the P1 region with an interface which has a dimension of 2D. For this reason, the transistor structure formed between the P2 region 12', the N region 8' and the P1 region 10' is the equivalent of or an embodiment of the double-weighted transistor structure 18 of FIG. 5.

Figure 8:
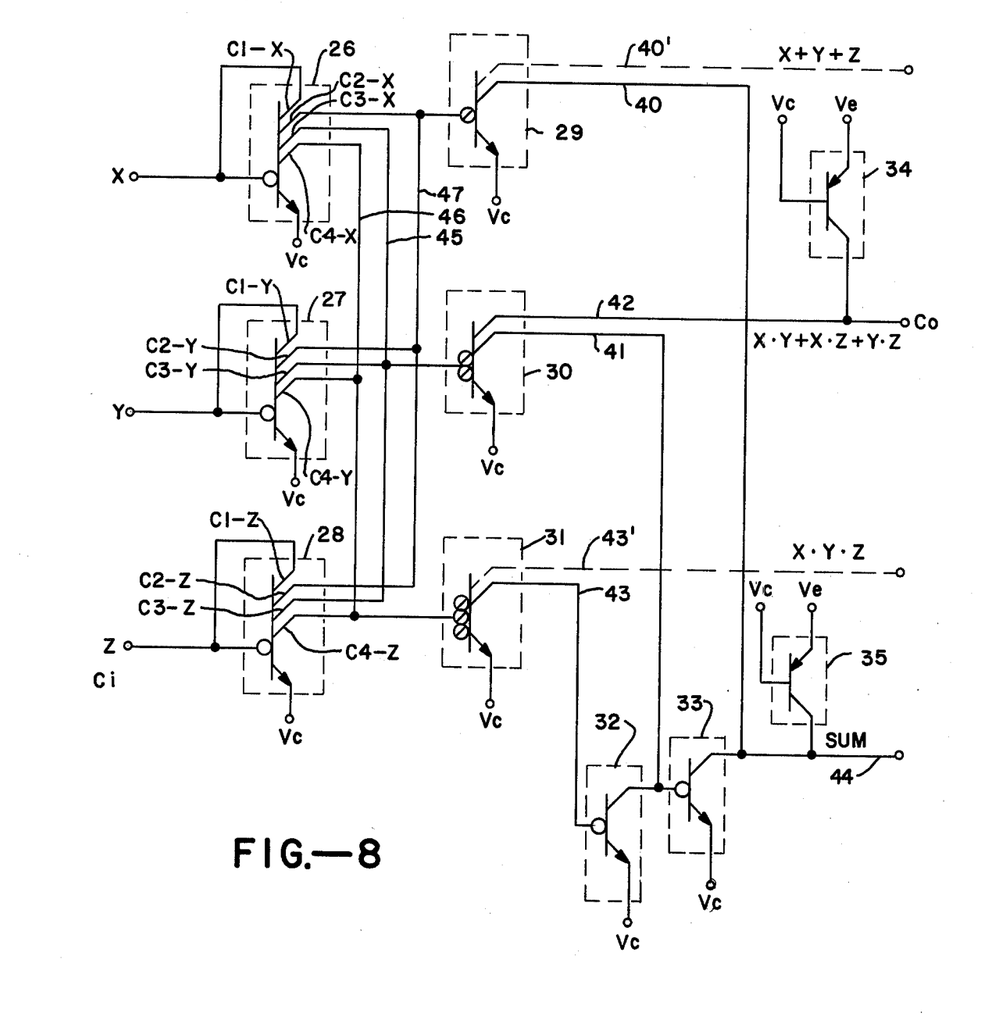
FIG. 8 depicts an electrical schematic representation of logical circuits formed by combinations of the injection devices of FIGS. 1 and 5 and which includes an OR circuit, a TWO-OUT-OF-THREE majority logic circuit, an AND circuit, an EXCLUSIVE-OR circuit and a full adder circuit.

Full Adder and Logical Circuits — FIG. 8

In FIG. 8, a full adder circuit is shown. The full adder employs threshold logic and is implemented using combinations of the circuits like those shown in FIGS. 1 and 5. The input transistors 26, 27, and 28 are each multiple-collector transistors like those indicated symbolically in FIG. 2 and schematically in FIG. 1. The bases of the transistors 26, 27 and 28 receive the X, Y and Z inputs, respectively. The collectors of transistor 26 provide the outputs C2-X, C3-X, and C4-X. The collector outputs of transistor 27 form the outputs C2-Y, C3-Y, and C4-Y. The collector outputs from the transistor 28 are C2-Z, C3-Z and C4-Z.

In FIG. 7, the output transistors 29, 30 and 31 are similar to the transistors shown symbolically in FIGS. 1 and 5. The transistor 29, however, is single-weighted, the transistor 30 is double-weighted and the transistor 31 is triple-weighted. The transistor 29 in FIG. 7 is similar to the FIG. 1 device except that transistor 29 does not include the collector to base normalization connection like the connection 14-1 in FIG. 1.

The double-weighted injection transistor of FIGS. 5 through 7 is suitable for use as the transistor 30 in FIG. 8.

The triple-weighted transistor 31 in FIG. 8 is formed, for example, by modifying the double-weighted structure of FIG. 7 in the following manner. Another leg (not shown) of the P2 region 12 is extended along tnhe bottom side of the P1 region to provide a third level of injection. The additional P2 leg is parallel to the leg 37, and is located on the opposite side of the P1 region and extends a distance of D.

The C2-X, the C2-Y, and the C2-Z collector outputs are connected in common and connect the base of transistor 29. The C3-X, C3-Y and the C3-Z collector outputs are connected in common and connect to the base of output transistor 30. The C4-X, C4-Y, and C4-Z collector outputs are connected in common and connect to the base of transistor 31.

Transistor 29, being a single-weighted transistor, is switched OFF when any one of the three transistors 26, 27, or 28 is ON. Transistor 30, being a double-weighted transistor, is switched OFF whenever any two of the three transistors 26, 27 and 28 is ON. Transistor 31, being a triple-weighted transistor, is switched OFF only when all three of the transistors 26, 27 and 28 are ON.

With the connections made in the manner described, the collector outputs from transistors 29, 30 and 31 form various logical outputs. Transistor 29 on its collector outputs 40 and 40' is a logical 1 when any one of the X, Y or Z inputs is a logical 1. The collectors 40 and 40', therefore, produce a one-or-more-out-of-three logical combination which is conventionally known as the logical OR function (X+Y+Z).

The collectors 41 and 42 of the output transistor 30 are logical 1's whenever any two out of three of the X, Y and Z inputs are logical 1's. The collectors 41 and 42 therefore have a majority logic output which is known as a two-or-more-out-of-three logical function (X·Y+X·Z+Y·Z).

The collectors 43 and 43' of output transistor 31 are logical 1's whenever the X, Y and Z inputs are all logical 1's. The logical function on collectors 43 and 43' is therefore a three-out-of-three function which is conventionally known as the logical AND function (X·Y·Z).

Combinations of the outputs from output transistors 29, 30 and 31 are also employed in FIG. 8 to form a full adder. The full adder includes the carry out, Co, signal on collector 42 which is, in fact, the two-out-of-three or more majority logic function.

Single-weighted transistor 32 receives the collector 43 output from output transistor 31 and functions as an inverter to form a complemented output, $(X \cdot Y \cdot Z)^*$. The collector 41 output from transistor 30 is connected to the collector output of transistor 32 to form a dot AND of the complemented output from transistor 32 and the output $(X \cdot Y + X \cdot Z + Y \cdot Z)$ from transistor 30. The AND'ed combination is input to inverting transistor 33 to form the output $[(X \cdot Y \cdot Z)^* \cdot (X \cdot Y + X \cdot Z + Y \cdot Z)]^*$. The collector output from transistor 29 or conductor 40 is connected to the collector output of transistor 33 to form, with a dot AND, the SUM output on conductor 44. The SUM output is the logical function $[(X \cdot Y \cdot Z)^* \cdot (X \cdot Y + X \cdot Z + Y \cdot Z)]^* \cdot [X + Y + Z]$ where the "*" indicates a complement of each enclosed expression. The SUM output is known as the EXCLUSIVE-OR function.

In connection with FIG. 8, the variable Z is conventionally known as the carry in, Ci, for an adder circuit.

When the Co and SUM outputs from the adder of FIG. 8 are to be employed as an input to a device not having a source of injection current, then injection transistors 34 and 35 are connected to the lines 42 and 44, respectively, to provide injection current.

Transistors 34 and 35 are like the injection transistor 3 in FIG. 1. If the adder of FIG. 8 is connected to circuits in which the input connections include injection transistors, then transistors 34 and 35 can be eliminated from the FIG. 8 adder.

In FIG. 8, the transistors 29, 30 and 31 have circles on the bases which each includes a diagonal bar. Those diagonal bars distinguish the level of injection from the transistors 26, 27, 28, 32 and 33 which do not contain such a diagonal bar. The transistors having the circle with a diagonal bar have a smaller magnitude injection current than the transistors with a circle without a bar. The reason for the difference is evident by examination of Eq. (4) above. With respect to any of the input transistors 26, 27, and 28, the collector current, Ic, is smaller than the injection current, Ii, in the amount defined by Eq. (4). Therefore, the injection current for transistors 29, 30 and 31 is made equal to the collector current for the transistors 26, 27 and 28. Hence, the injection current for transistors 29, 30 and 31 is less than injection current for transistors 26, 27 and 28.

Figure 9:
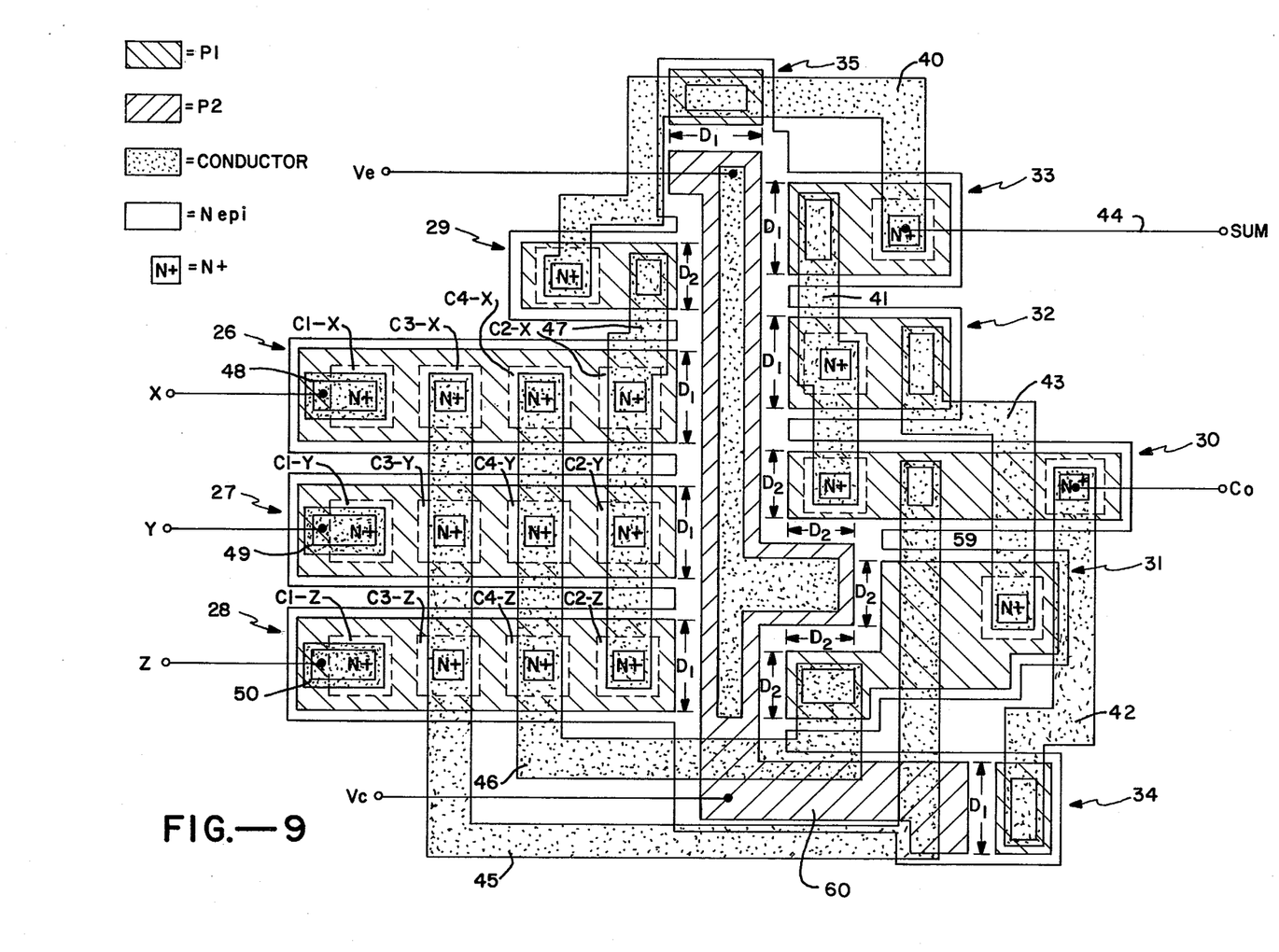
FIG. 9 depicts a top view of a semiconductor structure which is one embodiment of the FIG. 8 device.

Full Adder and Logical Circuit Structure — FIG. 9

In FIG. 9, a semiconductor structure which is one embodiment of the full adder circuit of FIG. 8 is shown. In FIG. 9, the cross-hatching from upper left to lower right represents the P1 region. The cross-hatch from upper right to lower left represents the P2 region. The stippling represents conductors which are typically metallization regions. The clear areas generally represent the N epitaxial regions. The N+ regions are generally labeled.

The layout in FIG. 9 organizes all of the transistors 26 through 35 of FIG. 8 around the central P2 region. The central P2 region is common to all of the transistors in FIG. 8. The P2 region carries a metallization layer over most of its upper surface to provide good conductivity from the Ve terminal to the P2 region.

In FIG. 9, the transistor 26 is a 4-collector transistor similar to that shown in FIGS. 3 and 4. The collectors C1-X, C2-X, C3-X and C4-X in FIG. 9 correspond to the collectors 11-1, 11-2, 11-3 and 11-4 in FIGS. 3 and 4. The P1/N interface juxtaposed the P2 region has a dimension of D1. The dimension D1 substantially controls the injection current into the P1 region of transistor 26 from the P2 region. The collector C1-X is connected by a conductor 48 to the P1 region to form the collector/base normalization connection in FIG. 9 which is analogous to the conductor 14-1 in FIGS. 3 and 4. The conductor 48 is connected also to the X input terminal.

In a similar manner, transistors 27 and 28 are 4-collector transistors like transistor 26. Transistors 27 and 28 receive the Y and input terminals. The Y terminal is connected to the conductor 49 for transistor 27 and the Z terminal is connected to conductor 50 for the transistor 28. Transistors 27 and 28 both have a P1 region with a P1/N interface having a dimension D1 which determines the level of injection current. Each of the transistors 26, 27 and 28 is a single-weighted injection transistor since the P1/N interfaces have the same dimension D1.

In FIG. 9, transistor 29 is arrayed similar to transistors 26, 27, and 28. Transistor 29 includes a single N+ collector region. The P1 region of transistor 29 has a dimension D2 at the P1/N interface. The D2 dimension in FIG. 9 is, in one embodiment, selected to be approximately 18 microns. This dimension is somewhat arbitrary and smaller or larger dimensions can be employed. In terms of the present state of semiconductor fabrication technology, however, 18 microns is a reasonably small dimension for achieving high circuit density. Of course, a general objective is to make all of the dimensions in FIG. 9 as small as possible.

The dimension D1 is approximately 1.35 times greater than the dimension D2. A quantity 1.35 is determined from Eq. (4) above where $\beta$ has a typical value of approximately 14. In Eq. (4), the value of $n$ is 4 since there are four collectors for the transistors 26, 27 and 28. The ratio of 4 to 14 is 0.35 which when added to 1 in Eq. (4) is equal to 1.35.

The FIG. 9 semiconductor structure is drawn approximately to scale. With P2 equal to approximately 18 microns, the whole structure of FIG. 9 is readily contained in a square 1000 microns on the side. Also, a significant portion of that 1000 micron square is not utilized by the full adder of FIG. 9. Hence, when other circuits are added, even greater densities are possible.

In FIG. 9, the collectors C3-X, C3-Y, C3-Z are connected to the P1 material of transistor 30 by the conductor 45. The N+ collectors C4-X, C4-Y and C4-Z are connected to the P1 base region of transistor 31 by the conductor 46. The N+ collector regions C2-X, C2-Y and C2-Z are connected to the P1 base region of transistor 29 by the metal conductor 47.

The output transistor 30 includes two N+ collector regions. The P1 base region has a dimension D2 which runs in a direction parallel to the dimenison D2 for transistor 29. Transistor 30 has a second interface having a dimension D2 which is juxtaposed the leg 59 in the P2 material. In this manner, the transistor 30 exhibits a double-weighted injection current which is conducted from the P2 region into the P1 region.

Transistor 31 is a triple-weighted injection transistor. The three weights of injection are derived from the three P1/N interfaces each having a dimension of D2.

In FIG. 9, the transistors 32 and 33 are each single-weighted injection transistors similar to transistor 29.

The transistors 32 and 33, however, have a P1/N interface which equals the dimension D1.

The transistors 34 and 35 are each P1/N/P2 devices which have a P1/N interface which equals the dimension D1. The dimension D1 for these transistors 34 and 35 is not critical and can be altered as a function of the desired current at the Co and SUM outputs.

In FIG. 9, the conductor 42 connects the N+ collector region of transistor 30 to the P1 collector region of transistor 34. The conductor 43 connects the N+ collector region of transistor 31 to the P1 base region of transistor 32. The conductor 41 connects the N+ collector regions of transistors 29 and 33 to the P1 collector region of transistor 35.

In FIG. 8, the maximum number of switching transistors which must be traversed from input to output is equal to 4. For example, a signal path through transistors 28, 31, 32 and 33 may be traveled in order to provide the SUM signal. Such a path traverses four switching transistors. Since each switching transistor (logic level) requires a finite time to be switched between the ON and OFF states, the number of lgoic levels is one indication of the speed of the circuit.

Figure 10:
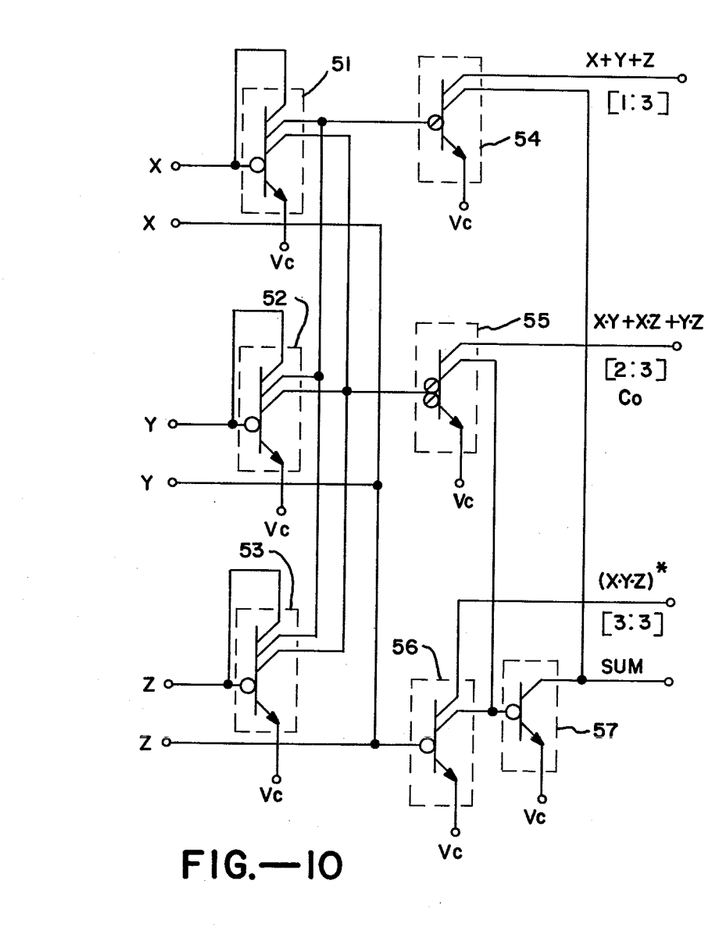
FIG. 10 depicts another embodiment of a full adder circuit similar to that of FIG. 8.

Alternate Full Adder and Logical Circuit — FIG. 10

In FIG. 10, the input transistors 51, 52 and 53 are each 3-collector injection transistors which are single-weighted. The 2-collector output transistors 54, 55 and 56 are single-weighted, double-weighted, and single-weighted, respectively. Transistors 54 and 56 can be 1-collector transistors if the logical OR and the logical NAND functions are not desired as separate outputs. Output transistors 54 and 55 have reduced injection current since they are connected to the collectors of normalized multiple-collector transistors 51 and 52, respectively.

In FIG. 10, X, Y and Z inputs are provided in duplicate. One set of the X, Y and Z inputs connects to the bases of transistors 51, 52 and 53, respectively.

The other set of inputs is connected in common as an input to the base of output transistors 56. The X, X and Z inputs are thereby dot AND'ed at the input to transistor 56. Transistor 56 acts as an inverter to provide on its two output collectors the complemented output $(X \cdot Y \cdot Z)^*$. The output from transistor 56 is the logical function. The output from transistor 56 is connected in common and therefore AND'ed with the output $(X \cdot Y + X \cdot Z + Y \cdot Z)$ from transistor 55. The AND'ed outputs from transistor 55 and 56 are input to the base of inverting transistor 57. The collector output from transistor 57 forms the function $[(X \cdot Y \cdot Z)^* \cdot (X \cdot Y + X \cdot Z + Y \cdot Z)]^*$ which when connected in common with the output $(X+Y+Z)$ from transistor 54 forms the SUM signal, $[(X \cdot Y \cdot Z)^* \cdot (X \cdot Y + X \cdot Z + Y \cdot Z)]^* \cdot (X+Y+Z)$.

The alternate full adder circuit of FIG. 10 provides the same logical outputs as the full adder of FIG. 8. FIG. 10 circuit differs in that the maximum number of logic levels which must be traversed from input to output in FIG. 10 is only three compared with four in FIG. 8. The FIG. 10 full adder by employing duplicated inputs reduces the maximum number of logic levels compared to the number of logic levels in a non-duplicated circuit like FIG. 8.

Figure 11:
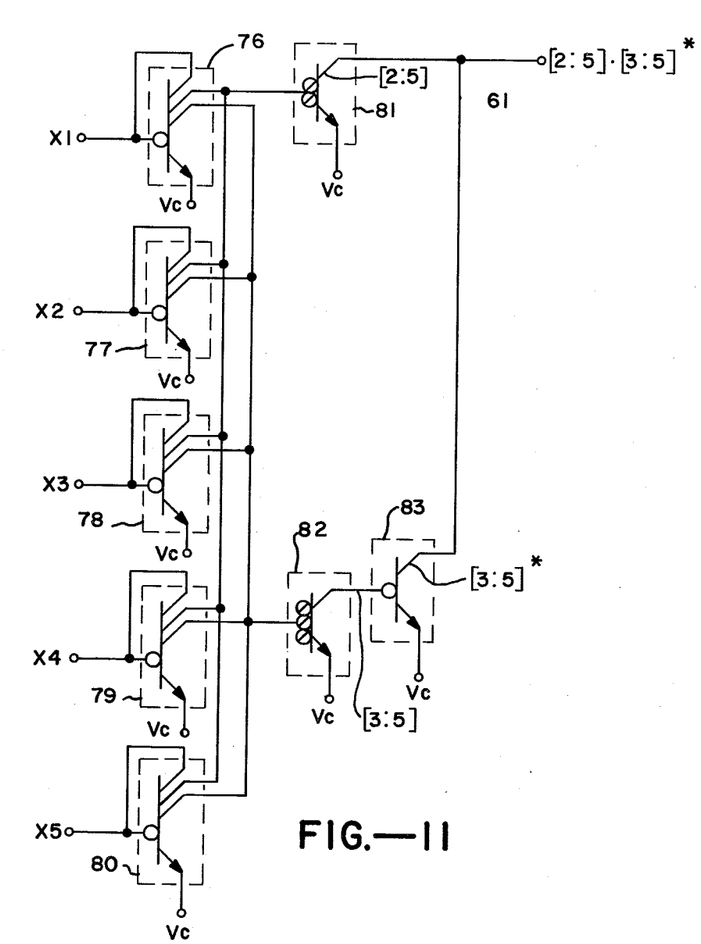
FIG. 11 depicts an electrical schematic representation of a TWO-OUT-OF-FIVE circuit.

Two-Out-of-Five Circuit — FIG. 11

In FIG. 11, a two-out-of-five majority logic circuit is shown. The circuit includes the 3-collector, single-weighted input transistors 76, 77, 78, 79 and 80. The input transistors 76 through 80 receive the inputs X1, X2, X3, X4, and X5, respectively. A double-weighted output transistor 81 and a triple-weighted output transistor 82 are provided. One collector from each of the input transistors 76 through 80 is connected in common and connected to the base input of the triple-weighted output transistor 81. Similarly, one output collector from each of the transistors 76 through 80 is connected in common and connected to the base input of the triple-weighted output transistor 82. The output from transistor 82 is in turn connected through the inverting transistor 83. The output from transistors 81 and 83 are connected in common to provide the two-out-of-five output.

In FIG. 11, the output from the transistor 81 is the two-or-more-out-of-five output, [2:5], given by the following expression:

$$[2:5] = X1 \cdot X2 + X1 \cdot X3 + X1 \cdot X4 + X1 \cdot X5 \\ + X2 \cdot X3 + X2 \cdot X4 + X2 \cdot X5 \\ + X3 \cdot X4 + X3 \cdot X5 \\ + X4 \cdot X5 \quad \text{Eq. (5)}$$

In Eq. (5), the output is a logical 1 when any two or more of the five inputs X1 through X5 are logical 1's. Two or more out of five inputs will be logical 1's under the conditions that more than two out of five inputs are logical 1's. For example, if three out of five of the inputs are logical 1's, the output from transistor 81 will also be a logical 1.

The transistor 82 provides an output on its collector which is a three-or-more-out-of-five function [3:5], defined as follows:

$$[3:5] = \\ X1 \cdot X2 \cdot X3 + X1 \cdot X2 \cdot X4 + X1 \cdot X2 \cdot X5 \\ + X1 \cdot X3 \cdot X4 + X1 \cdot X3 \cdot X5 \\ + X1 \cdot X4 \cdot X5 \\ + X2 \cdot X3 \cdot X4 + X2 \cdot X3 \cdot X5 \\ + X3 \cdot X4 \cdot X5 \\ + X4 \cdot X5 \cdot X2 \quad \text{Eq. (6)}$$

The output from transistor 82 will be a logical 1 whenever three or more of the X1 through X5 inputs are logical 1's. The [3:5] output from transistor 82 is inverted in transistor 83 to form the complemented output [3:5]*.

The outputs from transistors 81 and 83 are connected together in common to form a dot AND function which is [2:5]·[3:5]*. That output on line 61 is a logical 1 when and only when two out of five of the X1 through X5 inputs are logical 1's.

While the invention has been particularly shown and described with reference to preferred embodiments thereof, it will be understood by those skilled in the art that various changes in form details may be made therein without departing from the spirit and the scope of the invention.

We claim:
1. An integrated injection logic circuit responsive to a plurality of input currents to provide a predetermined output as a logical combination of the input currents comprising:
a plurality of first transistors, each having a base, plural collectors, and an emitter, with at least one of said first transistors having one collector connected to the base, the transistors connected to receive said input currents and capable of conduct- ing collector currents in response to said input currents, at least one additional transistor having an input electrode and including means for providing a threshold injection current to said additional transistor having a magnitude greater than said first transistor collector currents, the input electrode connected to the outputs of two or more of said first transistors for summing said first transistor collector currents to control the conduction state of said additional transistor as a function of the relationship between said summed first collector currents at said electrode and the weight of said injection current.

2. An integrated injection logic circuit responsive to a plurality of input currents to provide a predetermined output as a logical combination of the input currents comprising:

a plurality of first transistors, each first transistor having a base, a collector, and an emitter with at least one of said first transistors having one collector connected to the base, each first transistor connected at the base to receive one of said input currents and capable of conducting collector current in response to said one input current, one or more additional transistors, each additional transistor having an additional transistor base, an additional transistor emitter, and an additional transistor collector, each additional transistor having output injection means for supplying an output injection current to the additional transistor base having a weighted current greater than said first transistor collector currents, each additional transistor having the additional transistor base connected to two or more of the first transistor collectors for summing currents at said input additional transistor base for controlling the conduction state of said additional transistor as a function of the relationship between said summed currents at said additional transistor base and the magnitude of said output injection current.

3. The circuit of claim 2 in which said first transistors each include two or more first transistor collectors and wherein each of said first transistors includes means for connecting one of said collectors to the first transistor base to reproduce seperate first transistor collector currents in each of said two or more collectors for seperately summing each current at the respective additional transistor bases of said additional transistors.

4. The circuit of claim 3 wherein each of said first transistors includes first injection means for providing at the first transistor base a first injection current, Ii, for causing, when conducting, said first transistor collector current, Ic, to equal $Ii/(1+n/\beta)$, where $\beta$ is the collector/base current gain of said first transistor and where $n$ is the number of first transistor collectors of said first transistors.

5. The circuit of claim 4 wherein said output injection means for each of said additional transistors includes means for making said output injection current equal to said first transistor collector current.

6. The circuit of claim 4 including one of said first transistors having said first injection means including means for making said first transistor collector current equal to an integral multiple of said first transistor collector current for others of said first transistors.

7. The circuit of claim 2 wherein each of said first transistors includes a first N region forming said first transistor emitter, a first P region carried within said first N region and forming said input transistor base, and a second N region carried within said first P region and forming said first transistor collector, and wherein each of said additional transistors includes a second P region carried by said first N region and forming said additional transistor base; a third N region carried by said second P region and forming said additional transistor collector; said first N region forming said additional transistor emitter; said output injection means including a third P region juxtaposed said second P region and seperated from said second P region by said first N region, said third P region carried by said first N region and forming an injection emitter, said first N region forming an injection base and said second P region forming an injection emitter.

8. The circuit of claim 4 wherein each of said first transistors includes a first N region forming said first transistor emitter, a first P region carried within said first N region and forming said first transistor base, and a second N region carried within said first P region and forming said first transistor collector, wherein each of said additional transistors includes a second P region carried by said first N region and forming said additional transistor base; a third N region carried by said second P region and forming said additional transistor collector; said first N region forming said additional transistor emitter; said output injection means including a third P region carried by said first N region, juxtaposed said second P region and seperated from said second P region by said first N region, said third P region carried by said first N region and forming an output injection base and said second P region forming an output injection collector, and wherein said first injection means for each of said first transistors includes a P region carried by said first N region, juxtaposed said first P region and seperated from said first P region by said first N region, said fourth P region forming a first injection emitter, said first N region forming a first injection base, and said first P region forming a first injection collector.

9. The circuit of claim 8 including a first injection interface between said first injection base and said first injection collector in the region juxtaposed said first injection emitter; and wherein said output injection means includes an output injection interface between said output injection base and said output injection collector in the region juxtaposed said output injection emitter; and wherein the size of said output injection interface is less than the size of the first injection interface.

10. The circuit of claim 9 wherein said size of said output injection interface is equal to said size of said first injection interface multiplied by $1/(1+n/\beta)$ where $\beta$ is the collector/base current gain of said input transistor and where $n$ is the number of input collectors of said input transistors.

11. The circuit of claim 10 including one or more additional transistors each having said output injection interface with a size equal to an integral multiple of the size of said first injection interface multiplied by $1/(1+n/\beta)$ where $\beta$ is the collector/base current gain of said input transistor and where $n$ is the number of first transistor collectors of said first transistors.

12. An integrated injection logic circuit responsive to a plurality of input currents to provide a predetermined output as a logical combination of the inputs comprising,
  a plurality of input transistors, each input transistor having an input base, an input collectors and an input emitter, each of said input transistors including means for connecting one of said input collectors to the input base to produce a normalized input collector current in each of said two or more input collectors and wherein each of said input transistors includes input injection means for providing at the input base an input injection current, Ii, for causing, when conducting, said input collector current, Ic, to equal $Ii/(1+n/\beta)$, where $\beta$ is the collector/base current gain of said input transistor and where $n$ is the number of input collectors of said input transistors, each input transistor connected at the input base to receive one of said inputs to control the input collector/emitter conduction state in response to the logical level of said one of said inputs,
  one or more output transistors, each output transistor having an output base, an output collector and an output emitter, each output transistor having output injection means for supplying a weighted output injection current to the output base, including means for making said output injection current equal to an integral multiple of said input collector current, each output transistor having the output base connected to two or more of the input collectors for controlling the conduction state of said output transistor as a function of the conduction state of said two or more connected input collectors and as a function of said output injection current and further including a first one of said output transistors having means for making said output injection current equal to U times said input collector current; including a second one of said output transistors having means for making said output injection current equal to V times said input collector current where U and V are different integers; first connection means for connecting the base of said first one of said output transistors to one collector from each of at least U of said input transistors whereby said first one of said output transistors is OFF only when U of said input transistors are ON, second connection means for connecting the base of said second one of said output transistors to one collector from each of at least V of said input transistors whereby said second one of said output transistors is OFF only when V of said input transistors are ON.

13. The circuit of claim 12 including means for making U equal to 1 and means for making V equal to 2, wherein said input transistors include first and second multiple-collector transistors, where said first connection means includes means for connecting the base of said first output transistor to one collector from each of said multiple-collector transistors and wherein said second connection means includes means connecting the base of said second output transistor to one collector from each of said multiple-collector transistors, where the input bases of said first and second multiple-collector transistors are X and Y, whereby the collector output from said first output transistor is the logical OR of X and Y and whereby the collector output of said second output transistor is the logical AND of X and Y.

14. The circuit of claim 6 including a first one of said output transistors having means for making said output injection current equal to one times said input collector current; including a second one of said output transistors having means for making said output injection current equal to two times said input collector current; including a third one of said output transistors having means for making said output injection current equal to three times said input collector current, first connection means for connecting the base of said first one of said output transistors to one collector from each of said input transistors whereby said first one of said output transistors is OFF to provide a one-or-more-out-of-three signal when any one of said input transistors is ON; second connection means for connecting the base of said second one of said output transistors to one collector from each of said input transistors whereby said second one of said output transistors if OFF to provide a two-or-more-out-of-three signal when any two of said input transistors are ON; third connection means for connecting the base of said third one of said output transistors to one collector from each of said input transistors whereby said third one of said output transistors is OFF to provide a three-out-of-three signal only when all of said input transistors are ON.

15. The circuit of claim 14 including means for inverting said three-out-of-three signal, means for summing the inverted three-out-of-three signal and said two-or-more-out-of-three signal to form a partial signal, means for inverting said partial signal, and means for summing said inverted partial signal and said one-or-more-out-of-three signal to form a sum signal.

16. An integrated injection logic circuit responsive to a plurality of input currents to provide a predetermined output as a logical combination of the inputs comprising,
  a plurality of input transistors, each input transistor having an input base, two or more input collectors and an input emitter, each of said input transistors including means for connecting one of said input collectors to the input base to produce a normalized input collector current in each of said two or more input collectors and wherein each of said input transistors includes input injection means for providing at the input base an input injection current, Ii, for causing, when conducting, said input collector current, Ic, to equal $Ii/(1+n/\beta)$ where $\beta$ is the collector/base current gain of said input transistor and where $n$ is the number of input collectors of said input transistors, each input transistor connected at the input base to receive one of said inputs to control the input collector/emitter conduction state in response to the logical level of said one of said inputs,
  one or more output transistors, each output transistor having an output base, an output collector and an output emitter, each output transistor having output injection means for supplying a weighted output injection current to the output base, each output transistor having the output base connected to two or more of the input collectors for controlling the conduction state of said output transistor as a function of the conduction state of said two or more connected input collectors and as a function of said output injection current, said one or more output transistors each including means for making said output injection current equal to an integral multiple of said input collector current.

17. An integrated injection logic semiconductor structure having plural current inputs comprising, a plurality of input transistors capable of responding to plural input currents, each having an input emitter formed by a first N region, each having an input base formed by a first P region carried by said first N region, each having a plurality of input collectors formed by a plurality of spaced, second N regions carried by said first P region with at least one of said input transistors having one input collector connected to the input base, a plurality of output transistors each having an output emitter formed by said first N region, each having an output base formed by a second P region and carried by said first N region, and each having at least one output collector formed by at least one third N region carried by said second P region, a plurality of input injection transistors, one associated in injection communication with each of said input transistors, each of said input injection transistors having an input injection collector formed by said first P region of an associated input transistor, each having an input injection emitter formed by a fourth P region carried by said first N region and juxtaposed said input base, and each having an input injection base separating said fourth and said first P regions and formed by said first N region, a plurality of output injection transistors, one associated in injection communication with each of said output transistors, each having collector, emitter and base regions in combination of differing size from said input and output transistors and corresponding threshold injection current capability greater than the input currents, each having an output injection collector formed by said second P region of a corresponding output transistor, each having an output injection emitter formed by a fifth P region carried by said first N region and juxtaposed said input base each having an output injection base separating said fifth and third P regions and formed by said first N region.

means for connecting said output bases to one or more of said input collectors.

18. An integrated injection semiconductor structure forming a logic circuit responsive to a plurality of input currents to provide a predetermined output as a logical combination of the inputs comprising, a plurality of input transistors, each controlled by one of said inputs to be ON or OFF and each having an input emitter formed by a first N region, each having an input base formed by a first P region carried by said first N region, each having a plurality of input collectors formed by a plurality of spaced, second N regions carried by said first P region, each having a normalization connection between one of said input collectors and said input base and being capable of reproducing at each collector corresponding separate input collector currents in each of said input collectors for separately summing each current at the respective input bases of said output transistors, a plurality of output transistors each having an output emitter formed by said first N region, each having an output base formed by a second P region and carried by said first N region, and each having at least one output collector formed by at least one third N region carried by said second P region, a plurality of input injection transistors, one associated in injection communication with each of said transistors, each of said input injection transistors having an input injection collector formed by said first P region of an associated input transistor, each having an input injection emitter formed by a fourth P region carried by said first N region and juxtaposed said input base, and each having an input injection base separating said fourth and said first p regions and formed by said first N region, each of said input injection bases and said input injection collectors having an input injection interface, a plurality of output injection transistors, one associated in injection communication with each of said output transistors, each having an output injection collector formed by said second P region of a corresponding output transistor, each having an output injection emitter formed by a fifth P region carried by said first N region and juxtaposed said input base each having an output injection base separating said fifth and third P regions and formed by said first N region, each of said output injection bases and said output injection collectors having output injection interfaces, each of said output injection interfaces having a size smaller than said input injection interface, and capable of providing an injection current greater than the input currents.

means for connecting said output bases to one or more of said input collectors.

* * * * *